United States Patent [19]

Blangeard et al.

[11] 4,146,867

[45] Mar. 27, 1979

[54] ADJUSTABLE RESISTORS FOR HYBRID CIRCUITS

[75] Inventors: Gérard Blangeard; Jacques Robineau, both of Paris, France

[73] Assignee: Societe Lignes Telegraphiques et Telephoniques, Paris, France

[21] Appl. No.: 919,269

[22] Filed: Jun. 26, 1978

[30] Foreign Application Priority Data

Jul. 19, 1977 [FR] France .............................. 77 220530

[51] Int. Cl.² .......................................... H01C 10/00
[52] U.S. Cl. .................................... 338/195; 338/308
[58] Field of Search ....................... 338/195, 307–309; 29/620

[56] References Cited

U.S. PATENT DOCUMENTS

| | | | |
|---|---|---|---|
| 3,441,804 | 4/1969 | Klemmer | 338/308 X |
| 3,489,980 | 1/1970 | Masters | 338/308 |
| 3,930,304 | 1/1976 | Keller et al. | 338/195 X |

Primary Examiner—C. L. Albritton
Attorney, Agent, or Firm—Kemon & Estabrook

[57] ABSTRACT

High precision film resistors are designed as a main resistive element corresponding to half the total value associated with five additional resistive elements the values of each of which are successively half of the value of the preceding one plus one resistive element of the same value as the smallest element of the five above mentioned elements, each of the additional element is originally short-circuited, adjustment being performed by cancelling at least one of the short circuits. This design of the resistive elements allows a reduced number of short circuit suppressions than previously used designs with the same precision.

5 Claims, 3 Drawing Figures

ADJUSTABLE RESISTORS FOR HYBRID CIRCUITS

BACKGROUND OF THE INVENTION AND PRIOR ART

The invention concerns adjustable resistors in hybrid circuits.

In hybrid circuits technology, adjustable film resistors the resistance of which must be adjusted to a given value with a preset precision, for example of $10^{-3}$, consist of a main element in series with additional elements which are originally short-circuited by conductors. Adjustment consists in selecting the short circuits to be cancelled. Measuring the value of the resistance of the main element will determine which conductors must be cut for the purpose of increasing the resistance to its rated value. It is known to adjust the resistance during the measurement by means of a focused electromagnetic radiation serving to cut the conductors, as indicated in French Pat. No. 2,018,251, which was filed on May 29, 1970, by Siemens. According to this patent, the radiation may emanate from a laser, from an incandescent lamp or from a gas discharge. There exist automatic machines which measure the resistance of the main element of each resistor to be adjusted, which calculate from the result of said measurement the position of the short circuits to be cut off and which control the relative position of the resistor and of the beam in order that the latter may successively open the short circuits which are to be opened. Such machines are very costly and it is important to reduce the duration of the operation on each resistor so as to ensure a maximum working rate.

The object of the present invention is to provide a film resistor made of a resistive layer deposited on an insulating support consisting of a main element and short-circuited additional elements whose resistances are so chosen as to necessitate on average a minimum number of cuts of the short-circuiting conductors during the adjustment of a batch of resistors of like rated value and given precision.

BRIEF SUMMARY OF THE DISCLOSURE

According to the invention, a film adjustable resistor made of a main resistive element connected in series with additional resistive elements originally short circuited by conductors consists of said main element and a set of additional resistive elements the resistance ratios of which are respectively given by $f_n = (0.5)^n$ with $n = 1, 2, 3, 4, 5, 6$ being the rank of the element, the main element being the first with an extra additional element added of the same resistance value as the smallest additional element of said set.

According to a further feature of the invention, the main element includes a strip which has the same resistance value as the last additional element of the set.

The resistors according to the invention have the following advantages:

- the rated value $R_o$ of the resistance can be reached as long as the resistance of the main resistive element is between $R_o/2$ and $R_o$;
- the final precision of the adjustment is excellent (for example 2°/oo), while permitting a much lower precision of the values of the additional elements (3%);
- the overall dimensions of the resistor are small.

BRIEF DESCRIPTION OF THE FIGURES

The invention is described in detail in the following description, accompanied by FIGS. 1 to 3, which are given by way of non-limiting illustration, and in which.

DETAILED DESCRIPTION OF THE INVENTION

Figure 1:
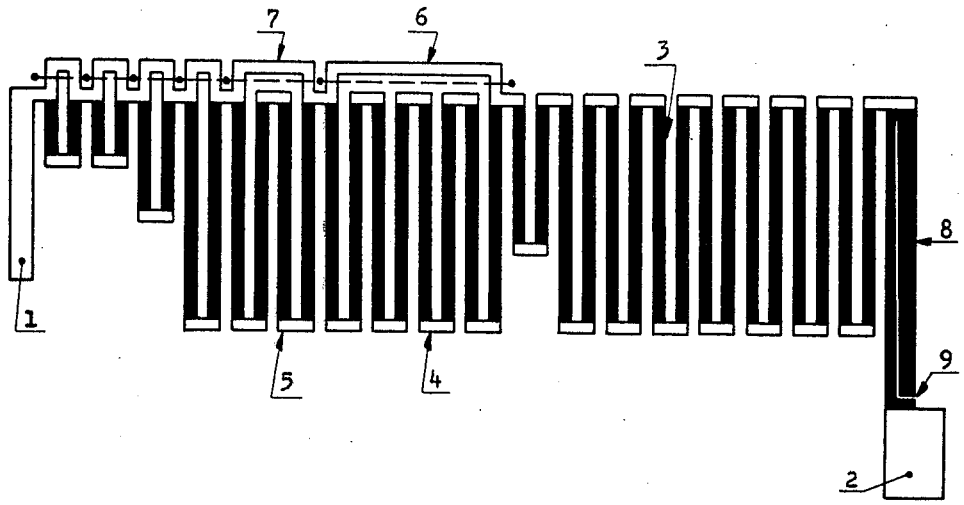
FIG. 1 illustrates a resistor according to the invention.

FIG. 1 illustrates a film resistor with terminal plugs 1 and 2. The first element 3, called the main element and representing by itself alone 50% of the total resistance, is in series with the additional resistive elements 4, 5, ..., which are short-circuited by construction by means of the conductors 6, 7, .... The fractions of the total resistance which correspond to the resistive elements are respectively ½ for 3, ¼ for 4, ⅛ for 5, 1/16, 1/32, 1/64 and 1/64. The first six terms form a geometric progression of rate $r = 0.5$. It is found, by experience, that the rated value $R_o$ is usually reached by cutting only part of the short circuits 6, 7, etc. Measurement of the resistance R of the main element 3 gives a proportionality factor $K = R/0.5 R_o$ which applies to the additional resistive elements 4, 5, etc. The resistance of these elements is respectively equal to $KR_o/4$; $KR_o/8$; $KR_o/16$; .... The short circuits of the additional elements to be opened are determined by calculating the sum $0.5 KR_o + \Sigma^i (0.5)^i KR_o \leq R_o$. The sum of the terms represented by $\Sigma^i (0.5)^i KR_o$ is determined by the following two conditions: if the difference between the two members of the preceding inequality is zero, adjustment is achieved; if this is not the case the left hand side is to be selected lower than $R_o$; the difference is comprised between $(0.5)^6 KR_o$ and O. A final adjustment is made by means of the groove 9 machined in the widened leg 8 of element 3 which will increase the resistance. The values of the factor K which are compatible with the adjustment of the resistance to the rated value are between 1 and 2. Experience has shown that the distribution of the values of K concerning a large number of resistors, for example $10^4$, is substantially uniform between 1 and 2 for mass production using well known film forming techniques. The range of values of K will vary the error of the adjustment of the resistance by means of the additional elements such as 4, 5, etc., from 0.015 $R_o$ when K is almost 1, to 0.030 $R_o$ when K is almost 2. The resistance of the widened portion 8 of the resistor 3 being also multiplied by the same factor K, the final precision of the adjustment may in all cases be kept to a preset value, for example $10^{-3}$.

Figure 2:
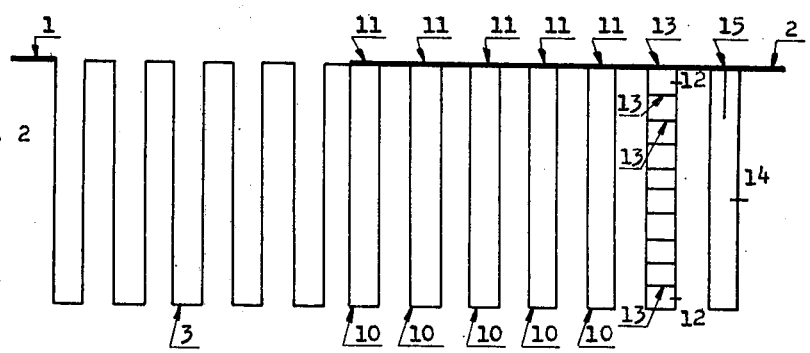
FIGS. 2 and 3 each illustrate variant resistors according to the invention. de

In order to quantitatively illustrate the advantages afforded by the fractional law for the resistance values of the elements that is to say resistance variations in accordance with the law $(0.5)^n R_o$, it has been assumed, in accordance with experience, that in a production batch, the measured values of the main elements are distributed uniformly from $0.5 R_o$ ($k = 1$) to $R_o$ ($k = 2$) and the number of short-circuiting conductors to be cut in order to adjust the resistances at a preset precision has been counted. The same count was also made with two other resistance variation laws of the additional elements. The first law taken as a comparison term, which is current in prior art of hybrid circuits, is illustrated in FIG. 2. The reference numbers of the elements, which are not changed as compared with FIG. 1 are the same. The five additional elements 10 are each designed at one-tenth of the total resistance. They are connected in series with the main resistive element 3 by cutting the associated short-circuiting conductor 11. Further additional elements 12 grouped in ladder form consist of 10 resistances designed at 1% of the total resistance. They are connected in series by cutting each conductor 13 one by one. FIG. 2 further shows a resistive strip 14 permitting a precision adjustment by machining slot 15. Calculation shows that the adjustment of fifty resistors produced in accordance with the latter law requires 2.92 times more cuts than the same number of resistors produced in accordance with the law of geometric progression and this ratio tends rapidly towards a limit equal to 3.02 reached when the number of resistors is equal to five hundred. The calculation is made for a uniform distribution of K between 1 and 2.

Figure 3:
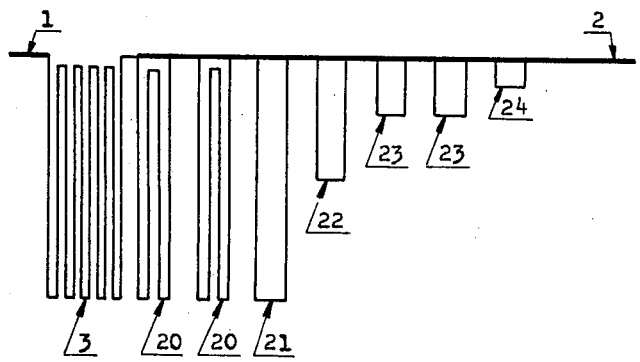

The second law selected for comparison sake is shown in FIG. 3. This resistor comprises a main element 3 plus 7 additional elements of which the two elements 20 measuring two-tenths of the total resistance each, element 21 measuring one-tenth of the total resistance, element 22 measuring five-hundredths of the total resistance, two elements 23 measuring two hundredths of the total resistance each and one element 24 measuring one-hundredth of the total resistance. This law represents the distribution of a box of weights. Among other merits, it leads to a compromise established by practice between precision and rapidity of measurement. When adjustment of such a resistor is limited to the use of the discrete additional elements (no slot such as 9 or 15), this law leads to a precision of adjustment which varies between 1% and 2% depending on the value of K. However, it has the disadvantage that it requires a number of cuts of the short-circuiting conductors which is larger than that which is necessary with the law of geometric progression of a rate of 0.5. Indeed, with uniformly distributed values of K between 1 and 2, it can be calculated that the adjustment of 50 resistors produced in accordance with the weight box law require 15% more cuts than the adjustment of 50 resistors produced in accordance with the geometric progression of a rate of 0.5. A batch of 500 resistors requires 20.6% more cuts; a batch of 5,000 resistors requires 20.4% more cuts; a batch of 50,000 resistors requires 20% more cuts.

If the dimensions of the widened portions respectively 8 and 15 in both the invention and FIG. 3 type resistors are the same, it becomes possible to correct errors of adjustment smaller than or equal to 0.015625 when $K = 1$. Consequently, it is possible to accept the same precision in the adjustment of the additional elements of the two types of resistances, i.e. 0.015625 when $K = 1$. With this assumption, it is calculated that 50 resistors produced in accordance with the weight box law require 3% of further cuts as compared with the number of cuts necessary for the adjustment of 50 resistors produced in accordance with the geometric progression of the invention. A batch of 500 resistors requires 7.8% more cuts; a batch of 5,000 resistors requires 8% more cuts; a batch of 50,000 resistors requires 8% more cuts.

In the case of the manufacture of medium size batches, the adjustment of resistors according to the invention require about 8% less short-circuit opening operations, with equal precision, than adjustment of resistors according to box weights distribution.

Comparison with the two laws which have been retained, the first because of its effective application in the hybrid circuit technique and the second because it is regarded as constituting a good compromise between rapidity of measurement and precision, shows the industrial importance of the invention.

What we claim:

1. A film adjustable resistor made of a main resistive element connected in series with additional resistive elements originally short circuited by conductors consists of said main element and a set of additional resistive elements the resistance ratios of which are respectively given by $f_n = (0.5)^n$ with $n = 1, 2, 3, 4, 5, 6$ being the rank of the element, the main element being the first with an extra additional element added of the same resistance value as the smallest additional element of said set.

2. A film adjustable resistor according to claim 1 in which said main element includes a widened strip which has alone the same resistance as said smallest additional element.

3. A film resistor according to claim 1 adjusted to a preset value through cut-off of at least one of said short circuiting resistors.

4. A film resistor according to claim 2 adjusted to a preset value through cut-off of at least one of said short circuiting resistors.

5. A film resistor according to claim 2 with a slot machined in said widened strip of said main element.

* * * * *